United States Patent
Yamawaku et al.

(10) Patent No.: US 8,257,498 B2
(45) Date of Patent: Sep. 4, 2012

(54) SUBSTRATE TRANSFER MODULE AND SUBSTRATE PROCESSING SYSTEM

(75) Inventors: Jun Yamawaku, Nirasaki (JP); Tsuyoshi Moriya, Nirasaka (JP)

(73) Assignee: Tokyo Electron Limited, Tokyo (JP)

( * ) Notice: Subject to any disclaimer, the term of this patent is extended or adjusted under 35 U.S.C. 154(b) by 1044 days.

(21) Appl. No.: 12/180,028

(22) Filed: Jul. 25, 2008

(65) Prior Publication Data

US 2009/0028672 A1    Jan. 29, 2009

Related U.S. Application Data

(60) Provisional application No. 60/983,284, filed on Oct. 29, 2007.

(30) Foreign Application Priority Data

Jul. 26, 2007  (JP) ................................. 2007-194810

(51) Int. Cl.
    *H01L 21/67* (2006.01)
(52) U.S. Cl. .................... 118/719; 414/217; 156/345.22
(58) Field of Classification Search ................ 414/217; 156/345.22, 345.23, 345.32, 345.31; 118/719
    See application file for complete search history.

(56) References Cited

U.S. PATENT DOCUMENTS

| | | | |
|---|---|---|---|
| 6,224,679 B1 * | 5/2001 | Sasaki et al. ................... | 118/719 |
| 6,649,019 B2 * | 11/2003 | Bernard et al. .......... | 156/345.29 |
| 2005/0087136 A1 * | 4/2005 | Moriya et al. ................ | 118/719 |
| 2008/0050924 A1 * | 2/2008 | Wakabayashi ................ | 438/706 |
| 2009/0028672 A1 * | 1/2009 | Yamawaku et al. ........... | 414/217 |
| 2009/0043419 A1 * | 2/2009 | Yamazaki et al. ............ | 700/228 |

FOREIGN PATENT DOCUMENTS

| | | |
|---|---|---|
| JP | 6-275578 A | 9/1994 |
| JP | 10-261690 A | 9/1998 |
| JP | 11-31730 A | 2/1999 |
| JP | 11-162934 A | 6/1999 |
| JP | 2000-21947 A | 1/2000 |
| JP | 2002-100786 | 4/2002 |
| JP | 2003-92335 A | 3/2003 |
| JP | 2003-303818 A | 10/2003 |
| JP | 2004-241643 A | 8/2004 |
| JP | 2005-44938 A | 2/2005 |
| JP | 2005-116823 A | 4/2005 |
| JP | 2005-354025 A | 12/2005 |
| JP | 2006-147859 A | 6/2006 |
| JP | 2007-157828 A | 6/2007 |
| WO | WO 2004/069698 A2 | 8/2004 |

OTHER PUBLICATIONS

Japanese Office Action issued on May 23, 2011 in corresponding Japanese Application No. 2007-194810 (with an English Translation).

* cited by examiner

*Primary Examiner* — Sylvia R. MacArthur
(74) *Attorney, Agent, or Firm* — Oblon, Spivak, McClelland, Maier & Neustadt, L.L.P.

(57) ABSTRACT

A substrate transfer module that can prevent corrosion of components, adhesion of particles to the substrate, and increases in the manufacturing cost and the size of the substrate transfer module. A substrate transfer module is connected to a substrate processing module. The substrate processing module implements desired processing on a substrate. A substrate transfer device transfers a substrate and includes a holding unit and a moving unit. The holding unit holds the substrate, and the moving unit moves the holding unit. A transfer chamber houses the substrate transfer device in an interior thereof that is isolated from an external atmosphere. An isolation device isolates at least the holding unit and the substrate held by the holding unit from an interior atmosphere of the transfer chamber.

18 Claims, 10 Drawing Sheets

SUBSTRATE TRANSFER MODULE AND SUBSTRATE PROCESSING SYSTEM

BACKGROUND OF THE INVENTION

1. Field of the Invention

The present invention relates to a substrate transfer module and substrate processing system, and more particularly to a substrate transfer module which includes a substrate transfer device for transferring a substrate.

2. Description of the Related Art

Substrate processing systems for implementing desired processing on substrates which are wafers for semiconductor devices (hereinafter simply referred to as "wafers") are well-known. One such substrate processing system includes a processing module which houses wafers and implements desired processing on the housed wafers, a load-lock module which is connected to the processing module and introduces and extracts wafers to and from the processing module, and a loader module (a substrate transfer module) which transfers wafers between a FOUP (Front Opening Unified Pod) housing a plurality of wafers and the load-lock module.

In the substrate processing system, the loader module includes a transfer chamber for housing the wafers. The processing module, the load-lock module and the transfer chamber of the loader module are connected together in the stated order. Although an interior of the processing module is maintained under near vacuum state, the pressure in an interior of the load-lock module can be switched between atmospheric pressure and near vacuum state. The pressure in the transfer chamber of the loader module is therefore maintained under at approximately atmospheric pressure.

The wafer transfer in the loader module is performed by a transfer arm provided in the transfer chamber. In the transfer chamber of the loader module, a unidirectional flow (a downward flow for instance) is produced by a fan filter unit provided in the loader module. The fan filter unit introduces an external atmosphere into the transfer chamber of the loader module, while removing debris from the external atmosphere using a built-in filter. This arrangement serves to prevent the introduction of debris which could cause occurrence of particles in the transfer chamber of the loader module.

In recent years, in response to demand for a way of reliably preventing attachment of particles, in particular, to the wafer, a dust-protection cover which is attached to the transfer arm and covers the upper-side of the wafer held by the transfer arm (see Japanese Laid-Open Patent Publication (Kokai) No. 2002-100786, for instance) has been developed.

However, in recent years types of the processing implemented on the substrate have been diversified, and corrosive gases (such as bromine gas, chlorine gas and fluorine gas) have come into use as a processing gas. When used, the corrosive gas can condense or solidify on the wafer which has undergone the processing in the processing module, and evaporate (to form outgas) after the wafer has been transferred to the loader module. The above-described dust-protection cover covers only the upper side of the wafer. This arrangement therefore has a shortcoming in that the components in the loader module corrode because the cover is unable to prevent the diffusion of the evaporated corrosive gas.

In recent years the grooves and the like formed in the wafer by etching have become finer. As a result, protection against finer particles (e.g. particles of a few tens of nm) is required. However, the fan filter unit is unable to remove particles of a few tens of nm. Since the transfer arm enters the load-lock module adjacent to the processing module, reaction products generated from the processing gas sometimes adhere to the transfer arm. These reaction products peel off in the transfer chamber of the loader module to form particles. Moreover, contacting portions of the transfer arm, for instance, parts of the pick may separate as a result of contact with the wafer, and form particles. That is, there are in the transfer chamber a large number of particles which require removal. Since the volume of the transfer chamber is large, it is difficult to remove all of the particles therein. Also, the above-describe dust-protection cover alone is not capable of reliably preventing particles from adhering to the wafer.

In the future, the diameter of wafers is set to increase further (to ϕ450 mm for instance), and there will be a corresponding increase in the size of the transfer chamber of the loader module. Since this will bring about a corresponding increase in the volume of the transfer chamber from which debris is to be removed, improvements in the functionality of the loader module, for instance, improvements in the processing capability of the fan filter unit to maintain the debris removing capability, are required. Since these increases will bring about increases in the size of the loader module components, there is a risk that the manufacturing cost and size of the loader module will increase.

SUMMARY OF THE INVENTION

The present invention provides a substrate transfer module and substrate processing system capable of preventing corrosion of components, adhesion of particles to the substrate, and increases in the manufacturing cost and the size of the substrate transfer module.

Accordingly, in a first aspect of the present invention, there is provided a substrate transfer module connected to a substrate processing module adapted to implement desired processing on a substrate, the substrate transfer module comprising a substrate transfer device adapted to transfer a substrate and including a holding unit adapted to hold the substrate and a moving unit adapted to move the holding unit, a transfer chamber adapted to house the substrate transfer device in an interior thereof that is isolated from an external atmosphere, and an isolation device adapted to isolate at least the holding unit and the substrate held by the holding unit from an interior atmosphere of the transfer chamber.

According to the first aspect of the present invention, at least the holding unit and the substrate held by the holding unit are isolated from the interior atmosphere of the transfer chamber. Hence, it is possible to prevent the diffusion of corrosive gas which has evaporated from the substrate, and thus to prevent corrosion of the components. Also, the space in which particles at risk of adhering to the substrate exist is limited to the space isolated in the isolation device. Hence, it is possible to easily remove all the particles at risk of adhering to the substrate, and thus to reliably prevent particles from adhering to the substrate. Moreover, the space from which debris is to be removed is limited to the space which is isolated in the isolation device. Hence, there is no need to improve the functionality of components to maintain the debris removing capability, and it is possible to prevent manufacturing cost and size of the substrate transfer module from increasing.

The first aspect of the present invention can provide a substrate transfer module, wherein the isolation device is an environment unit which surrounds at least surroundings of the holding unit and the substrate held by the holding unit.

According to the first aspect of the present invention, the environment unit surrounds at least the surroundings of the holding unit and the substrate held by the holding unit. Hence, the holding unit and substrate can be reliably isolated.

The first aspect of the present invention can provide a substrate transfer module, wherein the environment unit is made up of a dividable plurality of parts, and the holding unit and the substrate held by the holding unit are exposed when the plurality of parts is in a divided state.

According to the first aspect of the present invention, the holding unit and the substrate are exposed when the plurality of parts of the environment unit are divided. Hence, the substrate can be introduced and extracted to and from other components and the like. Also, it is possible to control the diffusion of the corrosive gas and the adhesion of particles to the substrate by controlling the period over which the plurality of parts is divided.

The first aspect of the present invention can provide a substrate transfer module, wherein the environment unit includes an opening and a door unit adapted to open and close the opening, and the holding unit and the substrate held by the holding unit are exposed when the door unit opens the opening.

According to the first aspect of the present invention, the holding unit and the substrate are exposed when the door unit of the environment unit opens the opening. Hence, the substrate can be introduced and extracted to and from other components and the like. Also, it is possible to control the diffusion of the corrosive gas and the adhesion of particles to the substrate by controlling the period over which the opening is opened.

The first aspect of the present invention can provide a substrate transfer module, wherein the environment unit includes a purge gas intake unit adapted to introduce purge gas to an interior of the environment unit and an exhaust unit adapted to exhaust the interior.

According to the first aspect of the present invention, purge gas is introduced into the interior of the environment unit and the interior is exhausted. The purge gas promotes evaporation of the corrosive gas adhered to the substrate, and the exhausting of the interior promotes the removal of the evaporated corrosive gas. As a result, it is possible to reliably prevent the diffusion of the corrosive gas.

The first aspect of the present invention can provide a substrate transfer module, wherein the environment unit includes a cleaning device adapted to spray a cleaning material at least towards the holding unit, and the cleaning material is one material selected from a group including an inert gas and an aerosol made up of an inert gas and a liquid.

According to the first aspect of the present invention, the cleaning material which is one material selected from a group including an inert gas and an aerosol made up of an inert gas and a liquid is sprayed towards at least the holding unit. Hence, unnecessary reactions on the substrate can be prevented, and the removal of reaction products adhered to the substrate can be promoted by collisions with the molecules of the inert gas and the liquid in the aerosol and reactions with the cleaning material.

The first aspect of the present invention can provide a substrate transfer module, wherein the cleaning device scans the holding unit.

According to the first aspect of the present invention, the cleaning device scans the holding unit. Hence, it is possible to remove reaction products and the like adhered to the holding unit, and thus suppress the generation of particles.

The first aspect of the present invention can provide a substrate transfer module, wherein the cleaning device scans from the holding unit to the moving unit.

According to the first aspect of the present invention, the cleaning device scans from the holding unit to the moving unit. Hence, it is possible to remove reaction products and the like from the substrate transfer device, and thus reliably suppress the generation of particles.

The first aspect of the present invention can provide a substrate transfer module further comprising an external atmosphere introducing device adapted to introduce the external atmosphere to the transfer chamber, wherein the external atmosphere introducing device includes a particle charging unit adapted to charge particles mixed in the introduced external atmosphere so as to generate a potential of a predetermined polarity, and the holding unit includes a potential generating unit adapted to generate, at a surface of the substrate, a potential of identical polarity to the predetermined polarity.

According to the first aspect of the present invention, the potential of the predetermined polarity is generated in the particles introduced to the transfer chamber and the potential of the polarity identical to the predetermined polarity is generated at the surface of the substrate. The particles are therefore subjected to a repelling force from the surface of the substrate. Hence, adhesion of the particles to the substrate can be reliably prevented.

The first aspect of the present invention can provide a substrate transfer module, wherein the isolation device includes an interior atmosphere introducing device adapted to introduce an interior atmosphere of the transfer chamber to a space isolated in the isolation device, the interior atmosphere introduction device includes a particle charging unit adapted to charge particles mixed in the introduced interior atmosphere so as to generate a potential of a predetermined polarity, and the holding unit includes a potential generating unit adapted to generate, at a surface of the substrate, a potential of identical polarity to the predetermined polarity.

According to the first aspect of the present invention, the potential of the predetermined polarity is generated in the particles introduced to the space isolated in the isolation device, and the potential of the polarity identical to the predetermined polarity is generated at the surface of the substrate. The particles are therefore subjected to a repelling force from the surface of the substrate. Hence, adhesion of the particles to the substrate can be reliably prevented.

The first aspect of the present invention can provide a substrate transfer module further comprising an external atmosphere introducing device adapted to introduce the external atmosphere to the transfer chamber, and a substrate charging device adapted to charge the substrate introduced to and extracted from the substrate processing module or a substrate housing vessel which houses the substrate and connects to the transfer chamber, wherein the external atmosphere introducing device includes a particle charging unit adapted to charge particles mixed in the introduced external atmosphere so as to generate a potential of a predetermined polarity, and the substrate charging device charges the substrate to generate a potential of identical polarity to the predetermined polarity.

According to the first aspect of the present invention, the potential of the predetermined polarity is generated in the particles introduced to the transfer chamber and the potential of the polarity identical to the predetermined polarity is generated in the substrate. The particles are therefore subjected to a repelling force from the substrate. Hence, adhesion of the particles to the substrate can be reliably prevented.

The first aspect of the present invention can provide a substrate transfer module further comprising inside the isolation device, a peripheral edge reaction product removal device adapted to irradiate a peripheral edge of the substrate held by the holding unit with laser light and to supply a reactive gas.

According to the first aspect of the present invention, in an interior of the isolation device, laser light is irradiated towards the peripheral edge of the substrate and a reactive gas is supplied. The reactions between the reaction products adhering to the peripheral edge and the reactive gas are promoted by the laser light. As a result, it is possible to reliably remove the reaction products which are adhering to the peripheral edge.

The first aspect of the present invention can provide a substrate transfer module, wherein an internal surface of the isolation device is covered by a photocatalyst.

According to the first aspect of the present invention, the internal surface of the isolation device is covered with a photocatalyst. Hence, it is possible to clean the internal surfaces by irradiation with ultra-violet light, and thus prevent reaction products and the like adhered to the internal surfaces from peeling, forming particles, and adhering to the substrate.

The first aspect of the present invention can provide a substrate transfer module, wherein the isolation device includes a potential generating device adapted to charge the isolation device to generate a potential of a predetermined polarity.

According to the first aspect of the present invention, the isolation device is charged to generate the potential of the predetermined polarity. By controlling the potential of the isolation device to have a polarity identical to the polarity of the particles, it is possible to use the resultant repelling force to reliably prevent the particles from adhering to the isolation device.

The first aspect of the present invention can provide a substrate transfer module, wherein the isolation device includes a vibration generating device adapted to cause the isolation device to vibrate.

According to the first aspect of the present invention, the isolation device vibrates. The vibration enables the removal of particles which have adhered to the isolation device. Consequently, it is possible to suppress the transfer of particles from the isolation device to the substrate.

The first aspect of the present invention can provide a substrate transfer module, wherein the isolation device includes a position adjusting unit located in an interior of the isolation device and adapted to adjust a position of the substrate housed in the interior thereof.

According to the first aspect of the present invention, the position adjusting unit for adjusting the position of the substrate is disposed in the interior of the isolation device. It is therefore possible to make quick adjustments to the position of the substrate held by the holding unit, and thus to improve the throughput of the substrate processing.

The first aspect of the present invention can provide a substrate transfer module further comprising a low-temperature device located so as to be exposed to an interior of the isolation device and having a temperature lower than an atmosphere of the interior.

According to the first aspect of the present invention, the low-temperature device having the temperature lower than the atmosphere of the interior is exposed to the interior of the isolation device. Corrosive gas molecules which have evaporated from the substrate and the bonding products of the corrosive gas molecules and other gas molecules in the atmosphere move towards the low-temperature device due to thermal migration. Hence, the corrosive gas can be reliably prevented from adhering to the substrate and components other than the low-temperature device.

The first aspect of the present invention can provide a substrate transfer module further comprising a heating device adapted to heat the substrate held by the holding unit in an interior of the isolation device.

According to the first aspect of the present invention, the substrate is heated in the interior of the isolation device. Corrosive gas molecules which have evaporated from the substrate and the bonding products of the corrosive gas molecules and other gas molecules in the atmosphere move away from the substrate due to thermal migration. Hence, the corrosive gas can be reliably prevented from adhering to the substrate and components other than the low-temperature device.

The first aspect of the present invention can provide a substrate transfer module comprising a plurality of the substrate transfer devices and a plurality of the isolation devices corresponding to the respective substrate transfer devices.

According to the first aspect of the present invention, the plurality of substrate transfer devices and the plurality of isolation devices corresponding to the respective substrate transfer devices are included. Hence, it is possible to efficiently transfer the plurality of substrates and to prevent the evaporated corrosive gas from moving from one substrate toward other substrates.

Accordingly, in a second aspect of the present invention, there is provided a substrate processing system comprising a substrate processing module adapted to implement desired processing on a substrate, a substrate housing vessel adapted to house the substrate, and a substrate transfer module connected to the substrate processing module and the substrate housing vessel, and adapted to introduce and extract the substrate to and from the substrate processing module and the substrate housing vessel, wherein the substrate transfer module includes a substrate transfer device adapted to transfer the substrate, the substrate transfer device including a holding unit adapted to hold the substrate and a moving unit adapted to move the holding unit, a transfer chamber adapted to house the substrate transfer device in an interior that is isolated from the external atmosphere, and an isolation device adapted to isolate at least the holding unit and the substrate held by the holding unit from an interior atmosphere of the transfer chamber.

The features and advantages of the invention will become more apparent from the following detailed description taken in conjunction with the accompanying drawings.

BRIEF DESCRIPTION OF THE DRAWINGS

FIG. 3A is a plan view showing a non-divided state, FIG. 3B is a side-elevation showing the non-divided state, FIG. 3C is plan view showing a divided state, and FIG. 3D is a side-elevation showing the divided state.

FIG. 6A is a plan view showing a closed state, FIG. 6B is a side-elevation showing the closed state, FIG. 6C is plan view showing an open state, and FIG. 6D is a side-elevation showing the open state.

FIG. 7A is a plan view showing the microenvironment unit at wafer transfer, FIG. 7B is a side-elevation showing the microenvironment unit at wafer transfer, FIG. 7C is plan view showing the microenvironment unit at introduction or extraction of the wafer, and FIG. 7D is a side-elevation showing the microenvironment unit at introduction or extraction of the wafer.

DETAILED DESCRIPTION OF THE PREFERRED EMBODIMENTS

The following describes an embodiment of the present invention with reference to the drawings.

Figure 1:
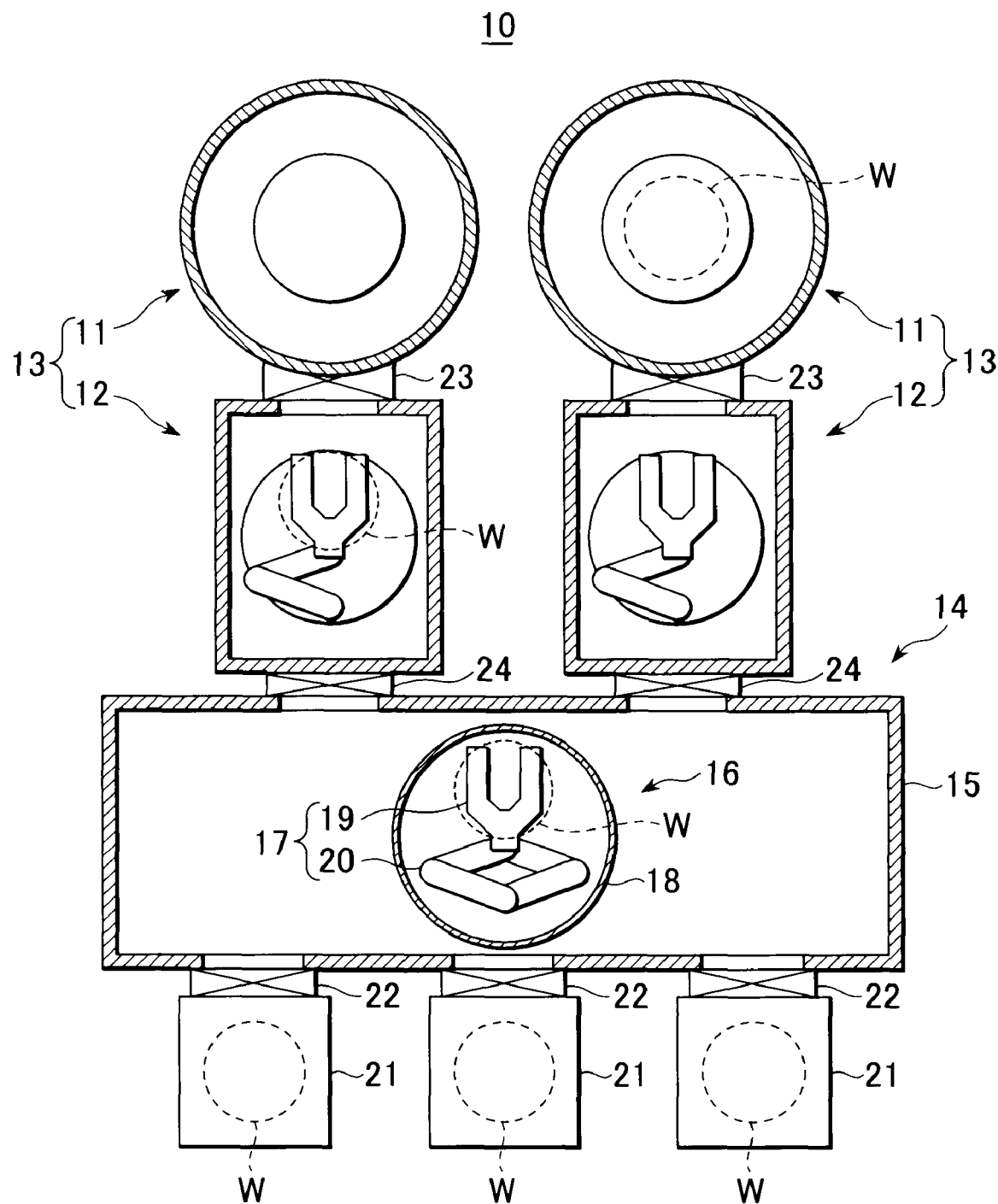
FIG. 1 is a horizontal cross-sectional view schematically showing a construction of the substrate processing system which employs the substrate transfer module according to an embodiment of the present invention.

FIG. 1 is a horizontal cross-sectional view schematically showing a construction of the substrate processing system which employs the substrate transfer module according to the embodiment.

As shown in FIG. 1, the substrate processing system 10 includes a single loader module 14 (substrate transfer module) and two process ships 13, each constructed using a processing module 11 (substrate processing module) for implementing an etching processing (desired processing) on a wafer W (substrate) and a load-lock module 12 for passing wafers W to and from the processing module 11. Since each of the process ships 13 connects to the loader module 14, the loader module 14 is connected to the respective processing modules 11 via the corresponding load-lock modules 12.

The loader module 14 includes a rectangular parallelepiped-like transfer chamber 15, and a substrate transfer device 16 housed in the transfer chamber 15 for transferring wafers W in the transfer chamber 15. Although an interior space of the transfer chamber 15 is isolated from the external atmosphere, the external atmosphere is introduced to the interior space of the transfer chamber 15 via a fan filter unit 32 which is described in a later section. Hence, the interior pressure of the transfer chamber 15 is maintained at atmospheric pressure.

Three FOUPs 21, which are substrate housing vessels each housing 25 wafers W, are connected to the transfer chamber 15 of the loader module 14 via three load ports 22 which are openings for loading the wafers W. Note that the two process ships 13 oppose the three FOUPs 21 across the transfer chamber 15.

In the loader module 14, the substrate transfer device 16 is movable in the transfer chamber 15 both in a vertical direction (a depth direction in FIG. 1) and in left and right directions (a longitudinal direction of the transfer chamber 15). The substrate transfer device 16 transfers unprocessed wafers W from the respective FOUPs 21 via the load ports 22 into the load-lock modules 12, and transfers the processed wafers W from the load-lock modules 12 to the FOUPs 21.

In the process ship 13, the internal pressure of the transfer chamber 15 of the loader module 14 is maintained at atmospheric pressure in the manner described above. The internal pressure of the processing module 11, on the other hand is maintained, at vacuum state. The load-lock module 12 is therefore constructed as a preliminary vacuum transfer chamber which includes a vacuum gate valve 23 at the joint with the processing module 11 and an atmosphere gate valve 24 at the joint with the loader module 14, and allows the internal pressure to be adjusted.

Figure 2:
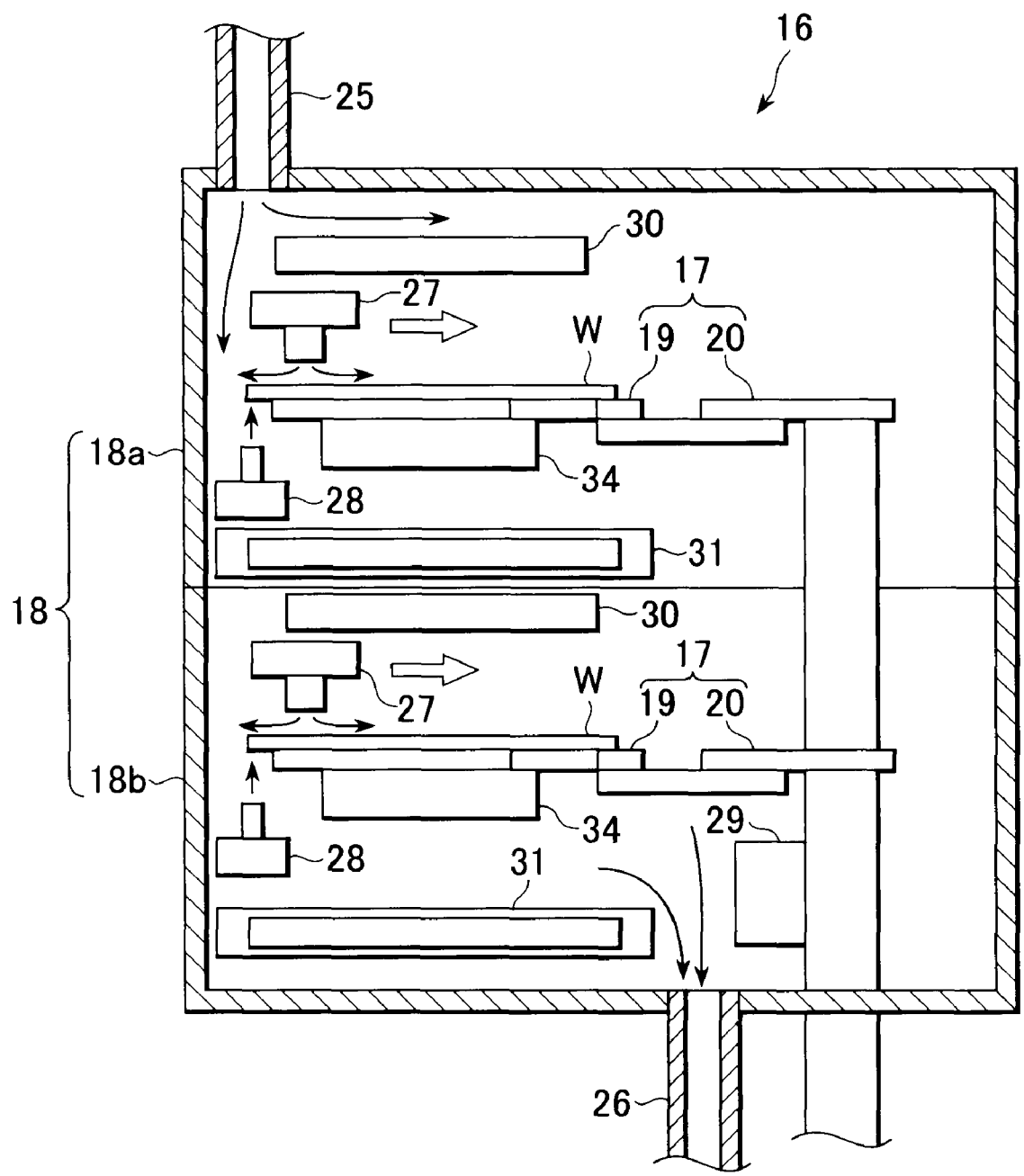
FIG. 2 is a cross-sectional view schematically showing a construction of the substrate transfer device in FIG. 1.

FIG. 2 is a cross-sectional view schematically showing the construction of the substrate transfer device in FIG. 1.

As shown in FIG. 2, the substrate transfer device 16 includes two transfer arms 17 arranged so as to be vertically aligned in the figure and a microenvironment unit 18 (isolation device). Each transfer arm 17 includes a fork-like pick 19 (holding unit) for picking up and holding the wafer W, and an arm portion 20 (moving unit) which is extendable in a horizontal direction (which lies in paper surface in FIG. 1) to allow free movement of the pick 19 in the horizontal direction. Each transfer arm 17 is also rotatable in a horizontal plane. According to the above construction, the substrate transfer device 16 is capable of freely transferring wafers W in the transfer chamber 15.

The microenvironment unit 18 is a cylindrical member made of a corrosion-resistant resin such as Teflon (Registered Trademark) PTFE, and houses the pick 19, the arm portion 20 and the wafer W held by the pick 19 of each transfer arm 17. By surrounding the pick 19, the arm portion 20 and the wafer W held by the pick 19, the microenvironment unit 18 isolates these components from the interior atmosphere of the transfer chamber 15.

As a consequence of being constructed using two separable parts (an upper part 18a and a lower part 18b), the microenvironment unit 18 can be divided.

Figure 3A:
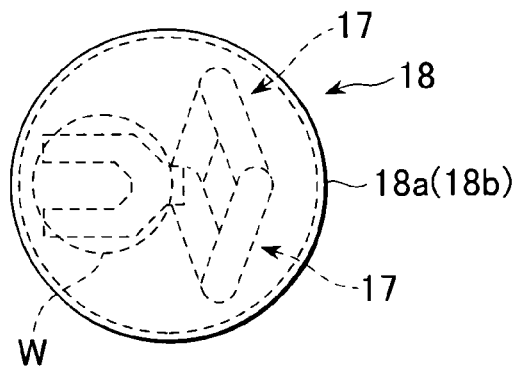
FIGS. 3A to 3D are views showing divided forms of a microenvironment unit in FIG. 2.
Figure 3B:
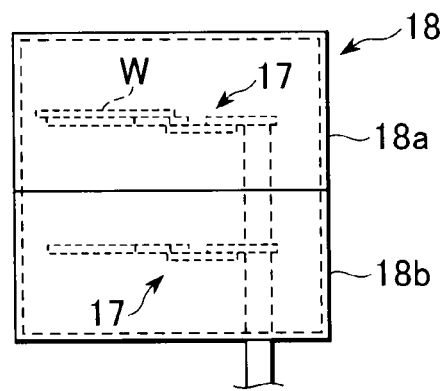
Figure 3C:
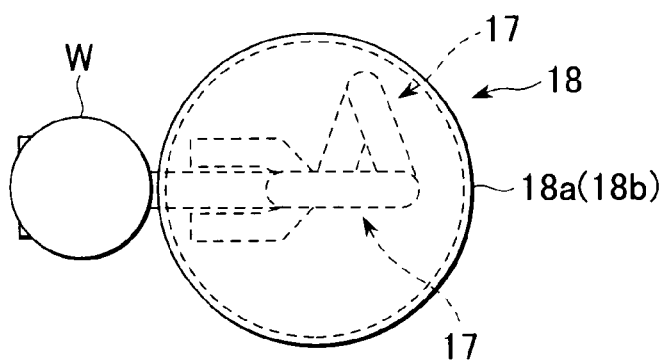
Figure 3D:
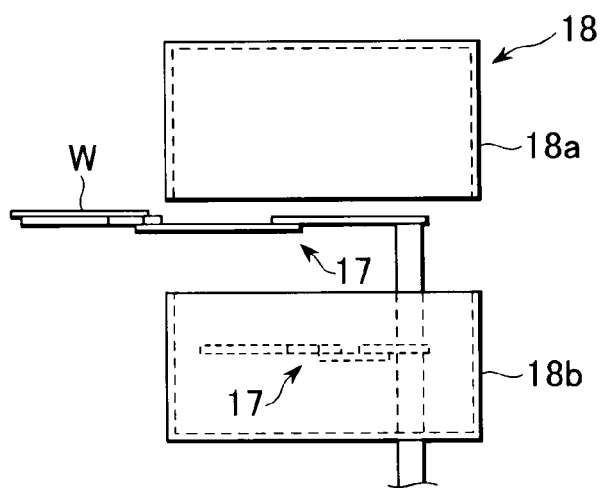
Figure 4:
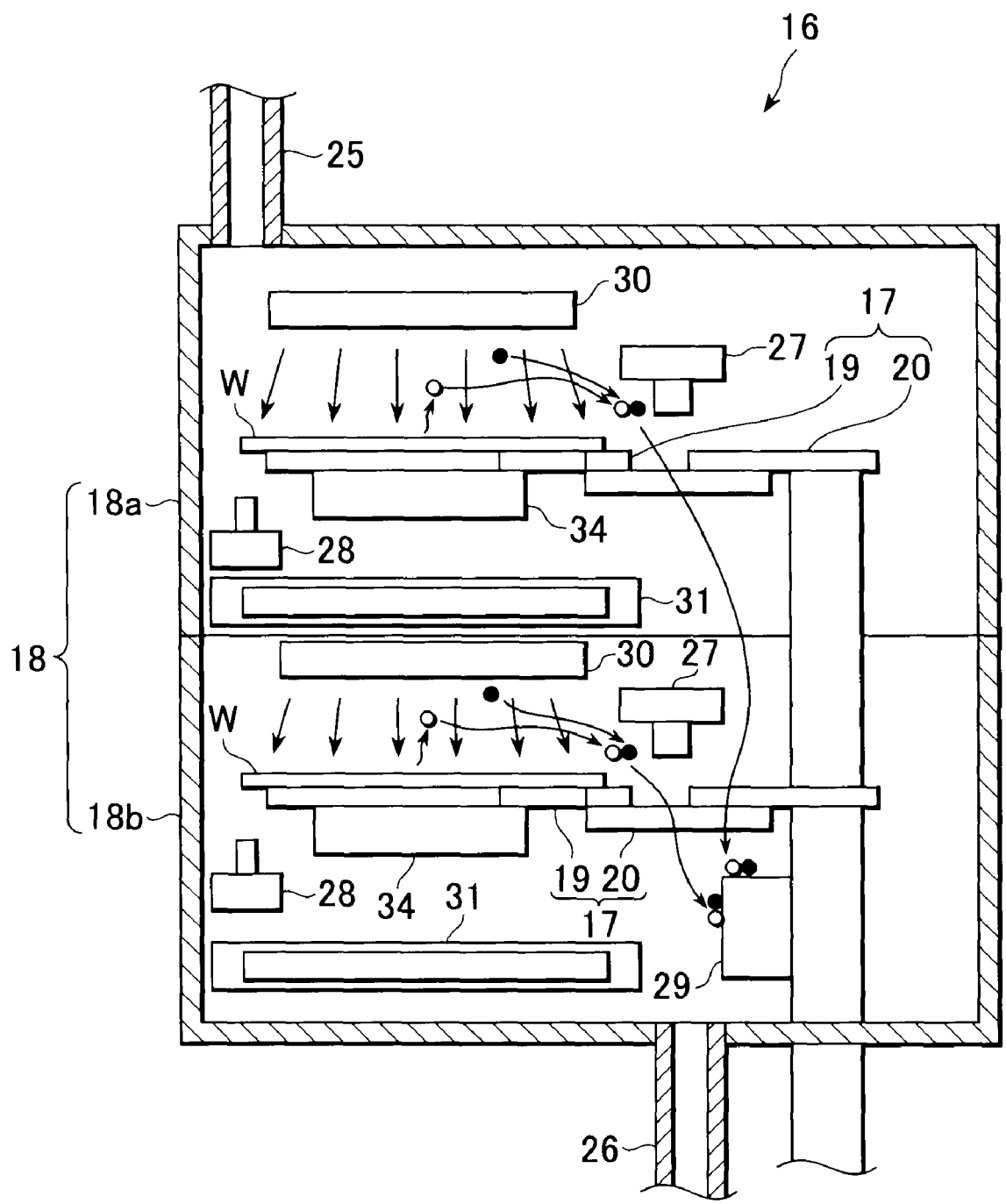
FIG. 4 is a cross-sectional view schematically showing a construction of the substrate transfer device in FIG. 1.

FIGS. 3A to 3D are views showing divided forms of the microenvironment unit in FIG. 2. FIG. 3A is a plan view showing a non-divided state, FIG. 3B is a side-elevation showing the non-divided state, FIG. 3C is plan view showing a divided state, and FIG. 3D is a side-elevation showing the divided state.

As shown in FIG. 3A and FIG. 3B, when in the non-divided state, the microenvironment unit 18 houses the two transfer arms 17 and the wafers W held by the picks 19.

As shown in FIG. 3C and FIG. 3D, when the microenvironment unit 18 is in the divided state, the upper transfer arm 17 is exposed. Since no barrier exists in an extension direction of the arm portion 20, the arm portion 20 is able to move the pick 19 holding the wafers W to a position outside the microenvironment unit 18. The pick 19 can thereby enter the interior of the load-lock modules 12 or the FOUPs 21. As a result, the substrate transfer device 16 can introduce and extract the wafers W to and from the load-lock modules 12 and the FOUPs 21.

The time period of separation of the upper part 18a and the lower part 18b is controlled by a controller (not shown in the figures) of the substrate processing system 10. Specifically, the time period of separation of the upper and lower parts is controlled to be extremely short.

FIG. 3C and FIG. 3D show the state in which the upper part 18a has been moved upwards. However, the lower part 18b is also movable downwards. When the lower part 18b is moved downwards, the lower transfer arm 17 is exposed.

Returning to FIG. 2, the microenvironment unit 18 includes a purge gas intake pipe 25 (purge gas intake unit) for introducing purge gas (such as steam or an inert gas (a noble gas, nitrogen gas or dry air)) to an interior of the microenvironment unit 18 (hereinafter, referred to as "unit interior"), and an exhaust pipe 26 (exhaust unit) for exhausting the unit interior.

Purge gas introduced from the purge gas intake pipe 25 promotes the evaporation of the corrosive gas (such as bromine gas, chlorine gas, or fluorine gas) which has condensed or solidified on the wafer W as a result of processing in the processing module 11, and the exhaust pipe 26 promotes removal of the corrosive gas produced by the evaporation.

The microenvironment unit 18 also includes a cleaning head 27 (cleaning device) which is disposed so as to oppose the pick 19 and sprays a cleaning material (such as an inert gas (a noble gas, or nitrogen gas or dry air) alone, or an aerosol made up of an inert gas and a liquid (such as water, an alcohol (ethanol, isopropyl alcohol or ethylene glycol) or another organic material). A different cleaning head 27 is provided for each transfer arm 17, and the two cleaning heads 27 move so as to scan the picks 19 and the arm portions 20 (in the direction indicated by the white arrows in the figures).

The cleaning material sprayed from the cleaning head 27 collides and reacts with reaction products which have adhered to the wafer W as a result of the processing in the processing module 11, thereby promoting the removal of the reaction products. Further, when the pick 19 is not holding the wafer W, the cleaning material removes the reaction products and the like adhered to the pick 19 or the arm portion 20. The removed reaction products and the like are discharged from the unit interior using the exhaust pipe 26.

Note that the cleaning head 27 is capable of spraying the cleaning material towards the pick 19 and the arm portion 20, the cleaning head 27 need not move, and may be fixed in one position.

The microenvironment unit 18 further includes a bevel polymer removal head 28 (peripheral edge reaction product removal device) which irradiates laser light towards a peripheral edge (bevel portion) of the wafer W held by the pick 19 and supplies a reactive gas (such as oxygen gas, hydrogen gas, or steam).

When laser light from the bevel polymer removal head 28 is irradiated and the reactive gas is supplied, reactions between the reaction products (such as the bevel polymer) adhering to the bevel portion and the reactive gas are promoted by the laser light. As a result, the reaction products adhering to the bevel portion are removed.

Additionally, internal surface of the microenvironment unit 18 is covered with a photocatalyst (such as rutile), and a UV lamp (not shown in the figures) is provided in the unit interior. When the photocatalyst is irradiated with UV light, the reaction products and the like adhering to the internal surface of the microenvironment unit 18 are decomposed into water and carbon dioxide as a result of the decomposing effect of the photocatalyst and removed.

In the present embodiment, because removal of the corrosive gas and the reaction products are performed in the manner described above in case which the microenvironment unit 18 is in the non-divided state, the corrosive gas and the reaction products can be prevented from leaking from the unit interior to the interior space of the transfer chamber 15.

Note that, at the removal of the above described corrosive gas, the evaporated corrosive gas reacts with molecules (such as water molecules) in the atmosphere of the unit interior to produce reaction products (such as $NH_4F$ and $NH_4Br$). It is then necessary to prevent the reaction products from adhering to the components located in the unit interior. However, the reaction products cannot always be completely discharged from the unit interior by simply exhausting through the exhaust pipe 26.

In the present embodiment, this problem is dealt with by including a cold trap 29 (low-temperature device) arranged to be exposed to the atmosphere in the unit interior and having a temperature at least 3° C. lower than the atmosphere of the unit interior, and an infra-red irradiation device 30 (heating device) arranged to oppose the pick 19 and heats wafer W held by the pick 19 to a temperature at least 3° C. higher than the atmosphere of the unit interior.

Generally, when the difference between the high-temperature portion and low-temperature portion is at least 3° C., the molecules of the reaction products move from the high-temperature portion to the low-temperature portion due to thermal migration. Hence, when the evaporated gas molecules of corrosive gas (denoted by ○ in the figure) and the molecules of the atmosphere (denoted by ● in the figure) react to produce the reaction products (denoted by ○● in the figure), the cold trap 29 adsorbs the reaction product molecules, and the wafer W heated by the infra-red irradiation device 30 repels the reaction product molecules. As a result, it is possible to prevent the reaction products from adhering to the components and the wafer W. Note that, since the corrosive gas adhering to the wafer W evaporates easily when it is heated, the infra-red irradiation device 30 may be used to promote the evaporation of the corrosive gas.

The microenvironment unit 18 has, provided in the unit interior, an orienter 31 (position adjusting unit) for adjusting the position of the wafer W. Normally, it is necessary to adjust the position of the wafer W before implementing the etching processing, but because the microenvironment unit 18 has the orienter 31 provided in the unit interior, the position of the wafer W can be adjusted immediately after extracting the wafer W from the FOUP 21. The user may desire to adjust the position of the wafer W after implementing the etching processing on the wafer W. In this case too, the position can be adjusted immediately after extracting the wafer W from the load-lock module 12. This arrangement allows the throughput of the etching processing to be improved.

Figure 5:
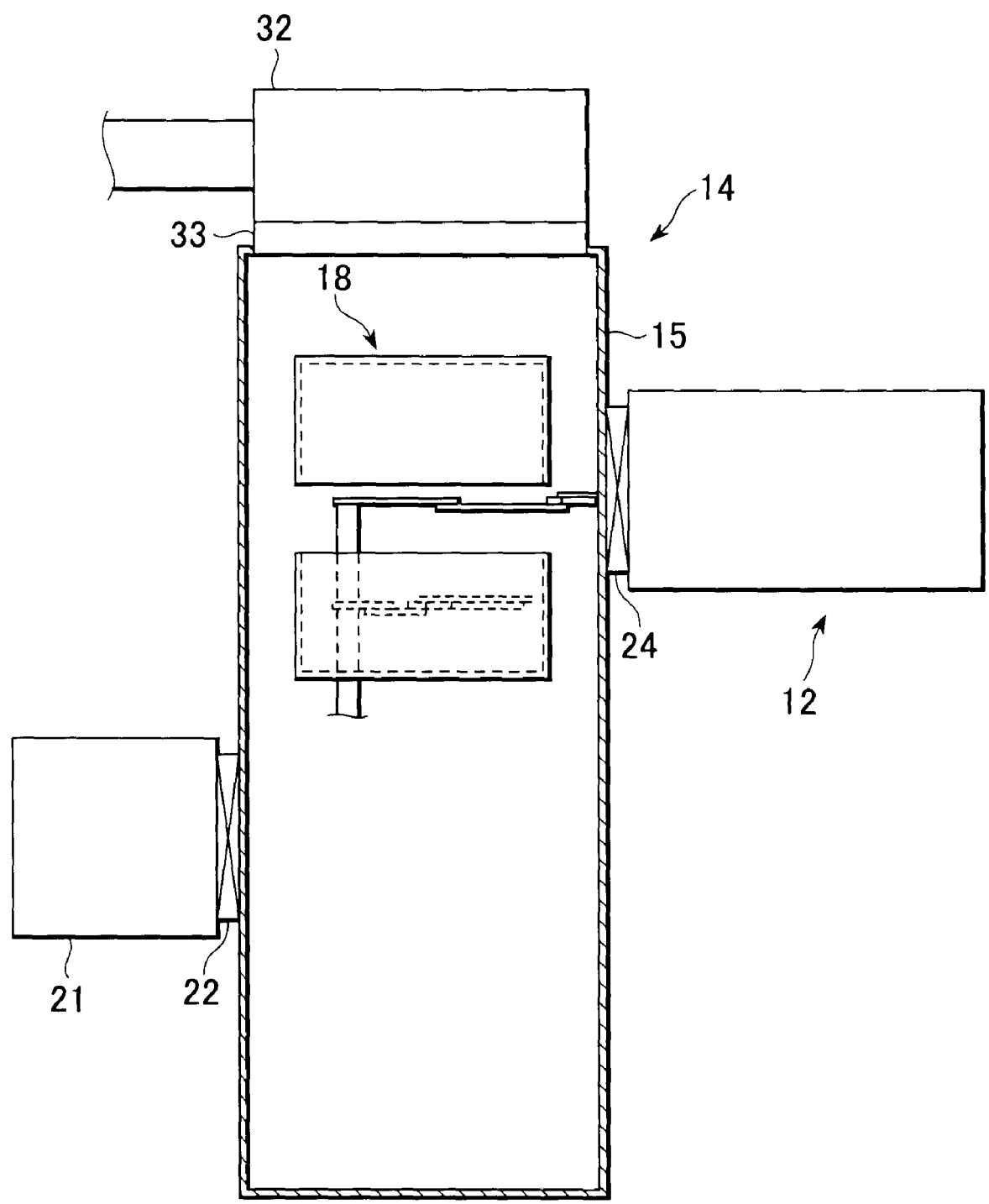
FIG. 5 is a cross-sectional view schematically showing a construction of the loader module in FIG. 1.

In the substrate processing system 10, the loader module 14 includes a fan filter unit 32 (external atmosphere introducing device) which introduces the external atmosphere to the interior of the transfer chamber 15, as shown in FIG. 5. The fan filter unit 32 is provided in the transfer chamber 15 and includes a filter (not shown in the figures) therein for removing debris mixed in the external atmosphere. However, as described above, the filter is not capable of removing particles of a few tens of nanometers in size. Hence, it is necessary to prevent the particles which pass through the fan filter unit 32 from adhering to the wafer W.

In the present embodiment, to prevent the particles from adhering to the wafer, the fan filter unit 32 includes an ionizer 33 (particle charging unit) and the pick 19 of each transfer arm 17 includes an electrode plate 34 (potential generating unit) (see FIG. 2). The ionizer 33 generates a potential of a predetermined polarity (a negative potential, for instance) in each particle by charging all of the particles mixed in the external atmosphere introduced into the transfer chamber 15 through the fan filter unit 32. The electrode plate 34 opposes the wafer W via the pick 19, and a voltage is applied to the electrode plate 34 so as to generate a potential of the same polarity as the particles (i.e. a negative potential).

At this point, a positive potential is generated at a surface of the wafer W which contacts the pick 19. However, since the pick 19 functions as an insulating body, current does not flow between the electrode plate 34 and the wafer W, and the positive potential generated at the surface of the wafer W which contacts the pick 19 is therefore maintained. Hence, a negative potential can be generated and maintained on the opposite surface of wafer W (i.e. on the surface exposed to the unit interior (hereinafter referred to as the "exposed surface")) to the surface that is in contact with the pick 19. Thus, the electrode plate 34 can generate a negative potential on the exposed surface of the wafer W. Since a negative potential has been generated on the particles introduced to the unit interior, the particles are subjected to a repelling force from the exposed surface. Since a barrier of negative potential is generated near the pick 19 by the electrode plate 34, the particles are also subjected to a repelling force from the barrier of negative potential. As a result, the particles are repelled from the wafer W. With this arrangement, the particles will never adhere to the wafer W.

According to loader module 14 of the present embodiment, the pick 19 and the wafer W held by the pick 19 are isolated from the interior atmosphere of the transfer chamber 15. Hence, it is possible to prevent the diffusion of corrosive gas which has evaporated from the wafer W, and thus prevent corrosion of the components of the loader module 14.

Also, in the loader module 14, the space in which particles at risk of adhering to the wafer W exist is limited to the space isolated in the microenvironment unit 18 (i.e. the space in the unit interior). Hence, it is possible to easily remove all the particles at risk of adhering to the wafer W using the exhaust pipe 26, and thus to reliably prevent particles from adhering to the wafer W.

Moreover, in the loader module 14, the space from which debris is to be removed is limited to the space in the unit interior. Hence, there is no need to improve the processing capabilities of components such as the fan filter unit 32 and the exhaust pipe 26 to maintain the debris removing capability, and it is consequently possible to prevent increases in the manufacturing cost and size of the loader module 14.

In the above-described loader module 14, the microenvironment unit 18 is made of a corrosion-resistant resin. The corrosive gas is therefore prevented from corroding the microenvironment unit 18 to form through holes or the like through which the corrosive gas could flow from the unit interior space into the transfer chamber 15.

Also, in the above-described loader module 14, the transfer arm 17 is exposed when the upper part 18a and the lower part 18b which make up the microenvironment unit 18 are in the divided state. Hence, it is possible to introduce and extract wafers W to and from the load-lock module 12 and the FOUPs 21 by extending and contracting the arm portion 20. Also, by controlling the time period for which the upper part 18a and the lower part 18b are divided to be extremely short, the diffusion of the corrosive gas and the adhesion of particles to the wafers W can be controlled.

In the above-described loader module 14, the purge gas is introduced to the unit interior and the unit interior is exhausted. Hence, the evaporation of the corrosive gas adhering to the wafer W is promoted by the purge gas and the removal of the evaporated corrosive gas is promoted by the exhausting of the unit interior. As a result, it is possible to reliably prevent the diffusion of the corrosive gas.

Also, in the above-described loader module 14, the cleaning material is sprayed towards the wafer W held by the pick 19. It is therefore possible to promote the removal of the reaction products adhered to the wafer W through collisions and reactions with the cleaning material. Note that, because the cleaning material is an inert gas alone, an aerosol composed of an inert gas and a liquid, or an aerosol composed of dry air and a liquid, it is possible to prevent unnecessary reactions from occurring on the wafer W. Moreover, the removal of the reaction products adhered to the wafer W can be further promoted by the collisions with the gas molecules of the inert gas or the liquid in the aerosol.

In the above-described loader module 14, the cleaning head 27 scans the pick 19 and the arm portion 20. It is therefore possible to remove the reaction products and the like adhered to the pick 19 and the arm portion 20, which is to say the transfer arm 17, and thus to suppress the generation of particles.

Also, in the above-described loader module 14, a negative potential is generated by the ionizer 33 on the particles introduced to the interior of the transfer chamber 15 and a negative potential is generated on the exposed surface of the wafer W by the electrode plate 34. The particles are therefore subjected to a repelling force from the exposed surface of the wafer W. Hence, adhesion of the particles to the wafer W can be prevented with greater reliability.

In the above-described loader module 14, the bevel portion of the wafer W in the unit interior is irradiated with laser light and reactive gas is supplied in the unit interior. The reactions between the reaction products adhering to the bevel portion and the reactive gas are promoted by the laser light, and it is consequently possible to reliably remove the reaction products adhered to the bevel portion.

Also, in the above-described loader module 14, the internal surfaces of the microenvironment unit 18 is covered with the photocatalyst, and the reaction products and the like adhering to the internal surface of the microenvironment unit 18 can therefore be decomposed as a result of the decomposing effects of the irradiation with UV light. The reaction products and the like are therefore prevented from peeling to form particles and adhering to the wafer W.

In the above described loader module 14, the orienter 31 is located in the unit interior. It is therefore possible to perform quick adjustments to the position of the wafer W, and thus to improve the throughput of the etching processing.

Also, in the above-described loader module 14, a cold trap 29 of a temperature at least 3° C. lower than the atmosphere in the unit interior is exposed to the atmosphere of the unit interior. Moreover, the wafer W is heated in the unit interior. The reaction product molecules are adsorbed by the cold trap 29 due to thermal migration. Moreover, the heated wafer W repels the reaction product molecules due to thermal migration. As a result, it is possible to prevent the reaction products from adhering to the components and the wafer W.

In the above-described loader module 14, to promote removal of the corrosive gas and reaction products from the wafer W, the substrate transfer device 16 includes the purge gas intake pipe 25, the exhaust pipe 26, the cleaning head 27, the bevel polymer removal head 28, the cold trap 29, the infra-red irradiation device 30, and the electrode plate 34. However, the substrate transfer device 16 need not include all of these construction elements, and any arrangement including the construction elements necessary to deal with the adhesion behavior of the corrosive gas and the reaction products to the wafer W is acceptable. For instance, the substrate transfer device 16 may include just one of the above-described construction elements for promoting the removal of the corrosive gas and the reaction products. Alternatively, the substrate transfer device 16 may include several of the above-described construction elements. In some cases, it may be acceptable for the substrate transfer device 16 to include none of the above-described construction elements.

Also, in the above-described loader module 14, the microenvironment unit 18 includes an orienter 31. However, the orienter 31 is not limited to being provided in the described position, and may be fitted in the transfer chamber 15 of the loader module 14.

Moreover, in the above-described loader module 14, the substrate transfer device 16 includes two transfer arms 17, but is not limited to having this number of transfer arms, and may include one, or three or more transfer arms.

In the above-described loader module 14, the microenvironment unit 18 divides vertically to expose the transfer arms 17. However, the microenvironment unit may include an opening and door which freely opens and closes the opening.

Figure 6A:
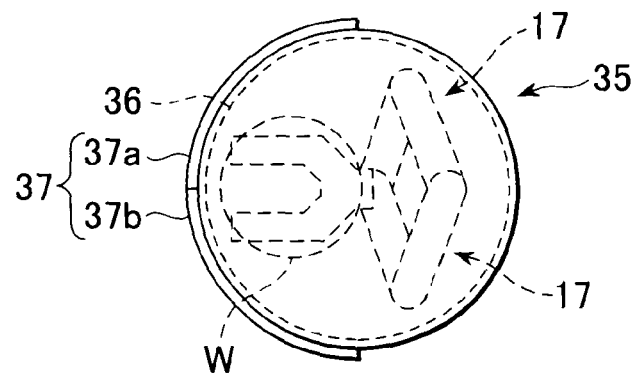
FIGS. 6A to 6D are views showing opened and closed forms according to a first variation of the microenvironment unit.
Figure 6B:
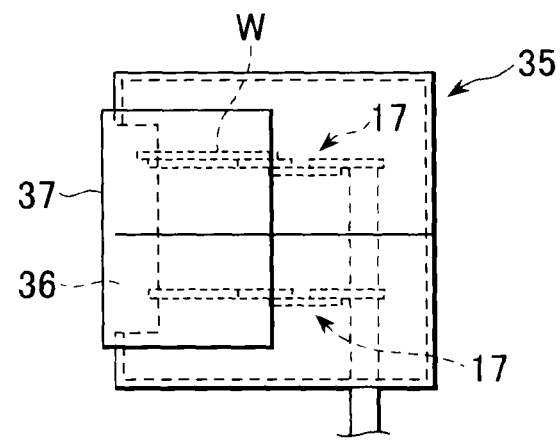
Figure 6C:
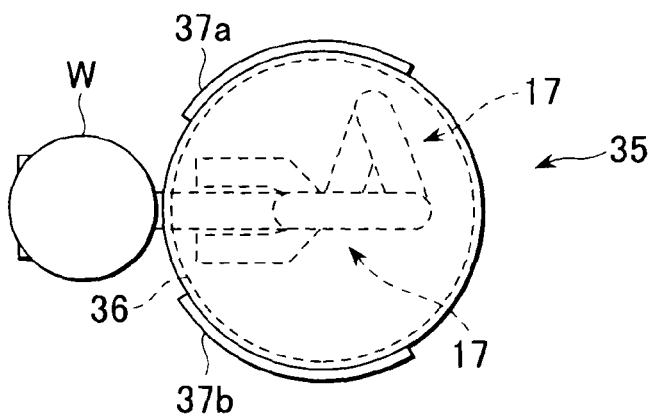
Figure 6D:
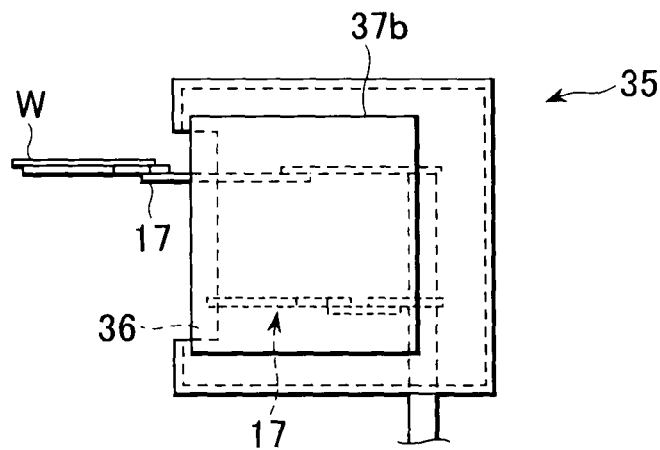

FIGS. 6A to 6D are views showing opened and closed forms according to a first variation of the microenvironment unit. FIG. 6A is a plan view showing a closed state, FIG. 6B is a side-elevation showing the closed state, FIG. 6C is plan view showing an open state, and FIG. 6D is a side-elevation showing the open state.

As shown FIG. 6A to 6D, the microenvironment unit 35 (isolation device) is a cylindrical member, houses the pick 19 and the arm portion 20 of each transfer arm 17 and the wafers W held by the picks 19, and isolates these elements from the interior atmosphere of the transfer chamber 15.

The microenvironment unit 35 includes an opening 36 in a sidewall, and a sliding door 37 for opening and closing the opening 36. Moreover, the opening 36 is provided so as to intersect the extension and contraction direction of the arm portion 20.

The sliding door 37 is made up of two curved plate members 37a and 37b which are provided on the sidewall and circumferentially aligned. The two curved plate members 37a and 37b can move freely in the circumferential direction. When the opening 36 is closed, the two curved plate members 37a and 37b move so as to contact each other, and the sliding door 37 forms a barrier to the arm portion 20 with respect to the extension and contraction direction. When the opening 36 is opened, the two curved plate members 37a and 37b move so as to separate from each other.

As shown in FIG. 6A and FIG. 6B, when the opening 36 is closed, the microenvironment unit 35 houses two transfer arms 17 and the wafers W held by the picks 19.

On the other hand, when the opening 36 is open as shown in FIG. 6C and FIG. 6D, the two transfer arms 17 are exposed. Since, when the opening 36 is open, no barrier exists in the extension and contraction direction of the arm portion 20, the arm portion 20 is able to move the pick 19 holding the wafer W to locations outside the microenvironment unit 35.

In the microenvironment unit 35, the transfer arm 17 is exposed when the opening 36 is opened. Hence, it is possible to introduce and extract wafers W to and from the load-lock module 12 and the FOUPs 21 by extending and contracting the arm portion 20. Also, by controlling the time period for which the opening 36 is open so as to be extremely short, the diffusion of the corrosive gas and the adhesion of particles to the wafers W can be controlled.

When the unit interior space is being exhausted normally, an exhaust flow can be generated in space of the unit interior, and the capability to remove corrosive gas which has evaporated from the wafer W improves. Hence, it is possible to prevent diffusion of the corrosive gas even if a portion of the microenvironment unit is open so that the unit interior space is in communication with the interior space of the transfer chamber 15.

Also, although the above-described microenvironment unit houses all portions of the transfer arm 17, the microenvironment unit may house only the pick 19 and the wafer W held by the pick 19.

Figure 7A:
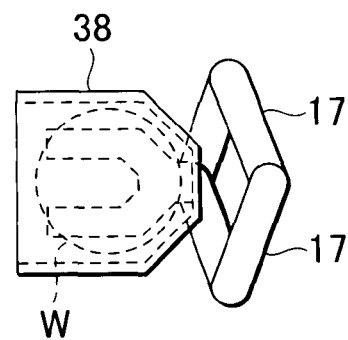
FIGS. 7A to 7D are views showing a second variation of the microenvironment unit.
Figure 7B:
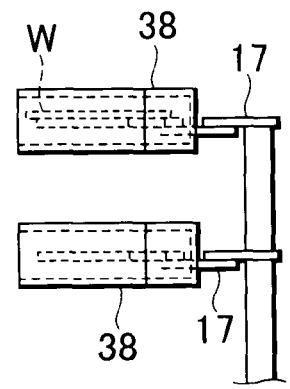
Figure 7C:
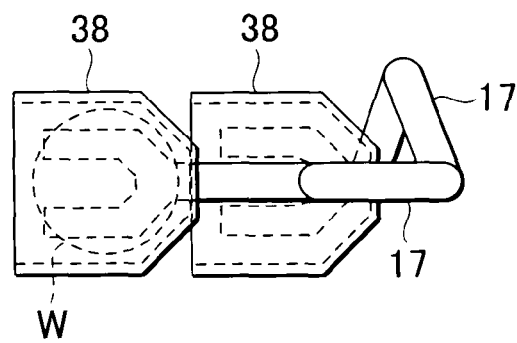
Figure 7D:
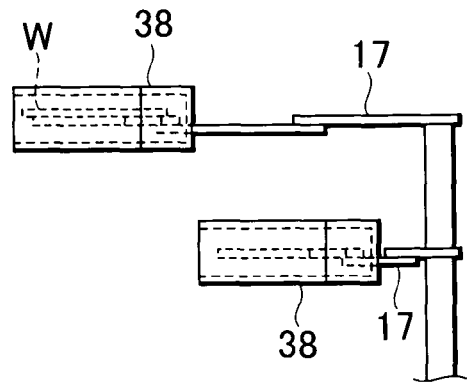

FIGS. 7A to 7D are views showing a second variation of the microenvironment unit. FIG. 7A is a plan view showing the microenvironment unit at wafer transfer, FIG. 7B is a side-elevation showing the microenvironment unit at wafer transfer, FIG. 7C is plan view showing the microenvironment unit at introduction or extraction of the wafer, and FIG. 7D is a side-elevation showing the microenvironment unit at introduction or extraction of the wafer.

As shown in FIGS. 7A to 7D, the loader module 14 includes a corresponding microenvironment unit 38 for each of the two transfer arms 17. Each microenvironment unit 38 houses only the pick 19 and the wafer W held by the pick 19. There is no sidewall in the extension and contraction direction of the arm portion 20, and the unit interior space is in communication with the interior space of the transfer chamber 15. The microenvironment unit 38 also includes an exhaust pipe (not shown in the figures) which, under normal conditions, exhausts the unit interior space.

Since the loader module 14 includes the two microenvironment units 38 corresponding to the respective transfer arms 17, it is possible to transfer a plurality of wafers W efficiently. Also, because each microenvironment unit 18 is independently provided, evaporated corrosive gas can be prevented from moving from one wafer W (e.g. a wafer which has undergone processing) transferred by the upper transfer arm 17 to the other wafer W (e.g. a wafer which has yet to undergo processing) transferred by the lower transfer arm 17. In each microenvironment unit 38, since an exhaust flow is generated in the unit interior and volume of the unit interior space is small, the capability for removing corrosive gas is favorable. Hence, the diffusion of the corrosive gas can be prevented. Further, since there are no movable portions of the type included in microenvironment unit 18 and the microenvironment unit 35 (the upper part 18a, the lower part 18b, and the curved members 37a and 37b), particles are not produced as a result of operations of the movable portions. Consequently, adhesion of the particles to the wafer W can be prevented with reliability.

In the above described loader module 14, the fan filter unit 32 is provided in the transfer chamber 15. However, because the internal volume of the transfer chamber 15 is large, it is necessary to maintain the capabilities of the fan filter unit 32, and the fan filter unit 32 cannot be super miniaturized. To enable miniaturization, the fan filter unit may be provided in the microenvironment unit.

Figure 8:
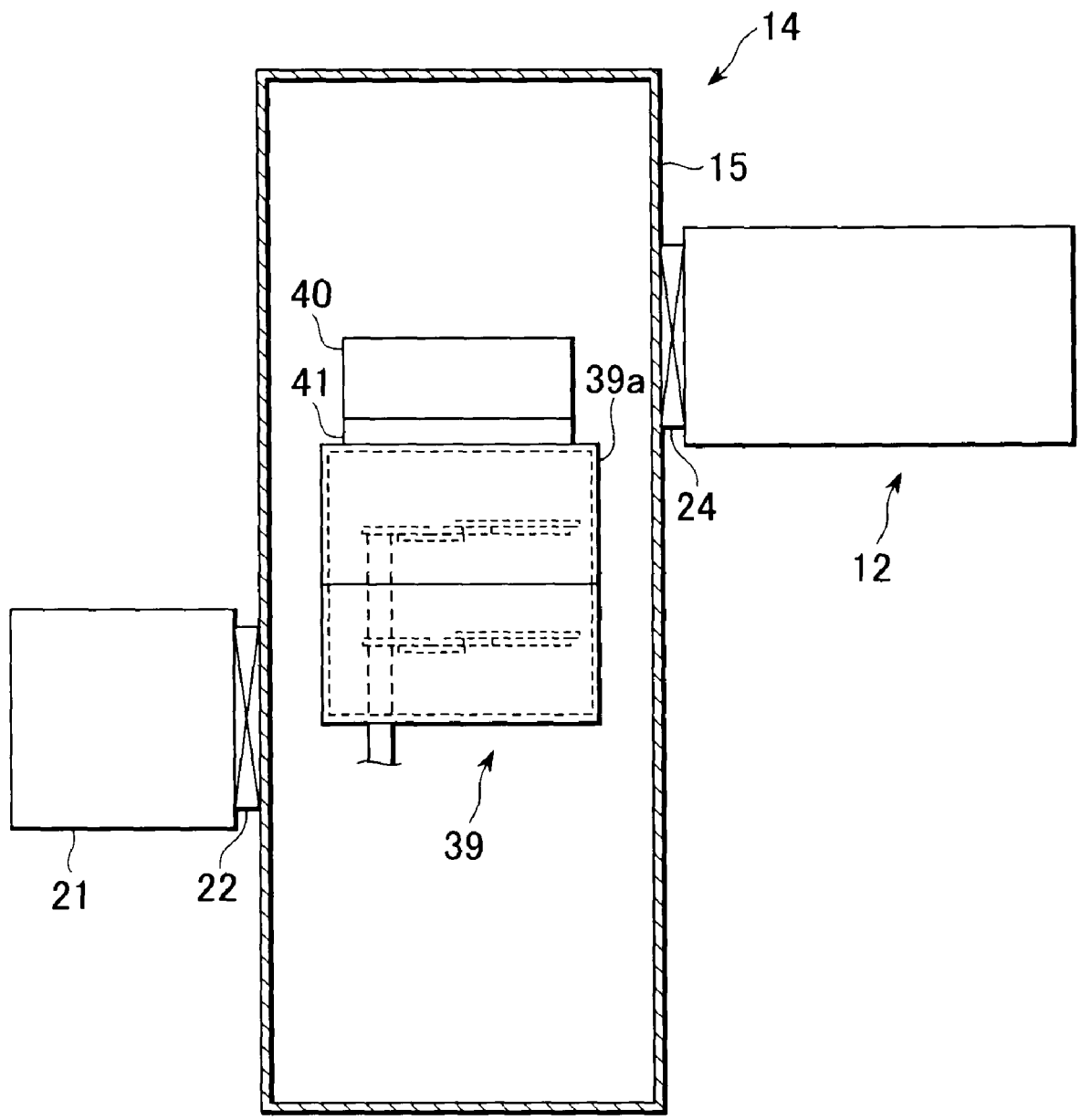
FIG. 8 is a view showing a case in which a fan filter unit is provided in the microenvironment unit.

FIG. 8 shows a case in which the fan filter unit is provided in the microenvironment unit.

As shown in FIG. 8, a microenvironment unit 39 includes a fan filter unit 40 in an upper part 39a. The fan filter unit 40 removes debris while introducing the interior atmosphere of the transfer chamber 15 to the unit interior space. The fan filter unit 40 further includes an ionizer 41. The ionizer 41 charges all particles mixed in the interior atmosphere of the transfer chamber 15 being introduced to the unit interior space through the fan filter unit 40, thereby generating a potential of a predetermined polarity (such as a negative potential) in all the particles. The construction of the microenvironment unit 39 otherwise resembles that of the microenvironment unit 18.

In unit interior space of the microenvironment unit 39, the electrode plate 34 generates a negative potential on the exposed surface of the wafer W and generates a barrier of negative potential in proximity to the pick 19. The particles are consequently subjected to a repelling force from the exposed surface and the negative potential barrier. Hence, adhesion of the particles to the wafer W can be prevented with greater reliability.

Also, in the above-described loader module 14, the potential of the desired polarity is only generated in the wafer W when the wafer W is held by the pick 19 and the voltage is applied by the electrode plate 34. However, a potential of a given polarity may be generated in the wafer W before or immediately after the wafer is held by the pick 19. Specifically, the wafer W may be charged by the processing in the processing module 11 to a potential which is opposite in polarity to the particles. When charged in this way, the wafer W will attract the particles.

Figure 9:
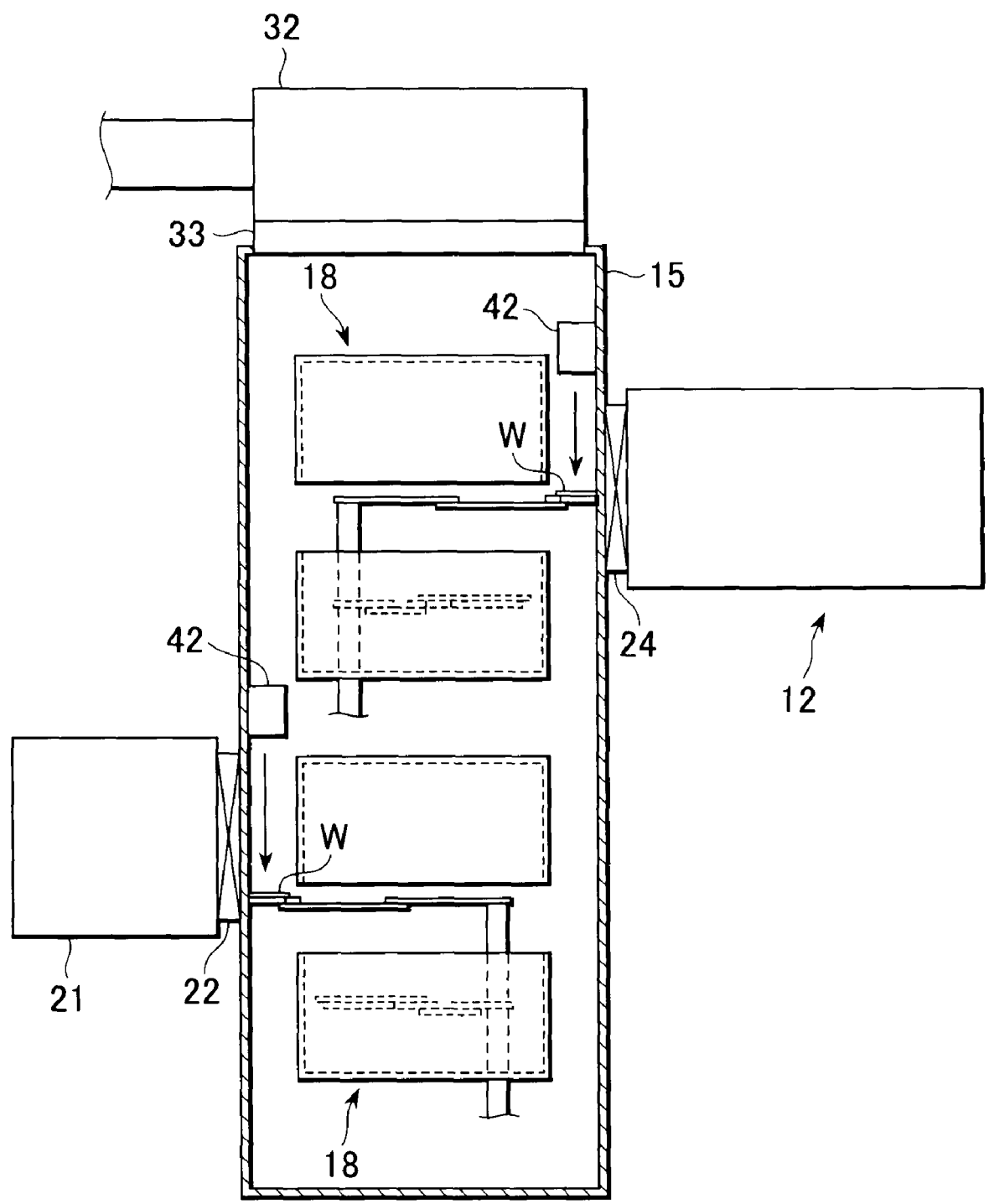
FIG. 9 is a plan view schematically showing a construction of a variation of the substrate transfer module according to the embodiment of the present invention.
Figure 10:
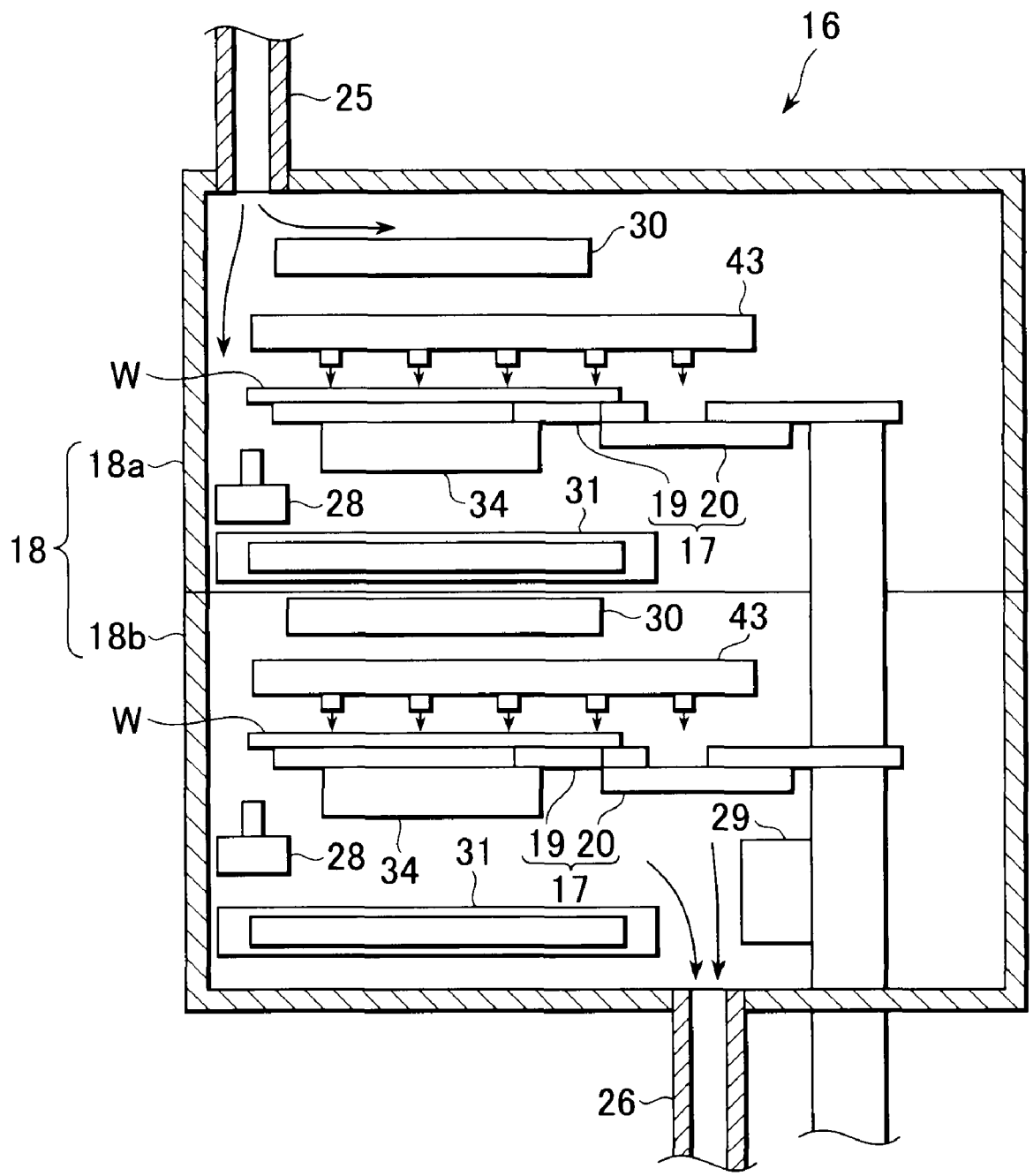
FIG. 10 is a cross-sectional view schematically showing a construction of a variation of the substrate transfer device in FIG. 1.

To deal with this, the wafer W may be forcibly charged when the wafer W is introduced to the interior of the transfer chamber 15. Specifically, an ionizer 42 (substrate charging device) is provided in proximity to the load port 22 or the atmosphere gate valve 24 in the transfer chamber 15 as shown in FIG. 9. Note that FIG. 9 shows two microenvironment units 18 for clarity.

As shown in FIG. 9, the ionizer 42 charges the wafer W introduced to the transfer chamber 15 from the FOUP 21 or the load-lock module 12 to forcibly generate a potential of identical polarity in the particles. Since the particles are then subjected to a repelling force from the wafer W, the particles can be reliably prevented from adhering to the wafer W, even when the wafer W has been charged by the processing. Also, since the wafer W is charged, there is no need to control the potential of the exposed surface of the wafer W. Consequently, the electrode plate 34 can be eliminated and the pick 19 can be miniaturized and lightened. As a result, it is possible improve the speed of the movement of the pick 19 and improve the throughput of the system.

In the above-described loader module 14, the microenvironment unit 18 includes the cleaning head 27 that scans the pick 19 and the arm portion 20. However, the microenvironment unit may include a shower head 43 (cleaning device) disposed so as to oppose the pick 19 and the arm portion 20 and having a plurality of cleaning material supply openings. With this arrangement, it is possible to remove the reaction products and the like adhering to the pick 19 and the arm portion 20 by spraying the cleaning material uniformly across the pick 19 and the arm portion 20, and thus to suppress the generation of particles.

Particles may adhere to the wafer W not only when the above-described particles mixed in the external atmosphere adhere to the wafer W, but also when particles adhering to the microenvironment unit 18 peel and transfer to the wafer W. To avoid this, particles can be prevented from adhering to the microenvironment unit 18, and those particles which have adhered to the microenvironment unit 18 can be actively removed. Specifically, the microenvironment unit 18 may be provided with an ionizer (not shown in the figures) (potential generating device) for charging the microenvironment unit 18 to generate a potential of the same polarity as the particles. Alternatively, the microenvironment unit 18 may be provided with a vibrator (vibration generating device) which causes the microenvironment unit 18 to vibrate in order to promote peeling of the particles.

Thus, the repelling force enables reliable prevention of the adhesion of particles to the microenvironment unit 18. Moreover, the particles which adhere to the microenvironment unit 18 can be removed. As a result, it is possible to suppress the transfer of particles from the microenvironment unit 18 to the wafer W.

In the loader module 14, the microenvironment unit 18 has an orienter 31. However, the microenvironment unit 18 may also include one or more of a stocker containing a dummy wafer, a vibration sensor, a position sensor for measuring the position of the wafer W, a temperature sensor for measuring the temperature of the wafer W, and a surface analyzing device for the wafer W (particle testing device, CD-SEM, ODP, microscope or film thickness measurement device).

In each case, the wasteful transfer of the wafer W for storage or to make measurements is unnecessary, and throughput can therefore be improved. Also, diffusion of the corrosive gas from dummy wafers can be prevented. Moreover, sensors can be cleaned by introducing the purge gas from the purge gas intake pipe 25 and spraying the cleaning material from the cleaning head 27. Thus, a high level of sensitivity can be maintained in the sensors. In addition, since test results from the sensors and surface analysis results can be obtained quickly, the subsequent processing in the case of etched wafers W, and the recipe for the etching processing in the case of wafers W which have still to be etched, can be optimized quickly.

What is claimed is:

1. A substrate transfer module connected to a substrate processing module adapted to implement desired processing on a substrate, the substrate transfer module comprising:
    a substrate transfer device adapted to transfer a substrate and including
        a holding unit adapted to hold the substrate, and
        a moving unit adapted to move the holding unit;
    a transfer chamber adapted to house the substrate transfer device in an interior thereof that is isolated from an external atmosphere; and
    an isolation device adapted to isolate at least the holding unit and the substrate held by the holding unit from an interior atmosphere of the transfer chamber, wherein
    the isolation device defines a tubular space, and the tubular space is formed by combining two tubular parts, each of which has one end being closed and another end being opened, so as to form a closed space,
    the two tubular parts are vertically separable from each other so that the tubular space is divided, and
    the holding unit and the substrate held by the holding unit are exposed when the two tubular parts are separated vertically from each other so that the tubular space of the isolation device is divided.

2. The substrate transfer module according to claim 1, wherein
    the isolation device is an environment unit that surrounds at least surroundings of the holding unit and the substrate held by the holding unit.

3. The substrate transfer module according to claim 2, wherein
    the environment unit includes
        a purge gas intake unit adapted to introduce purge gas to an interior of the environment unit, and
        an exhaust unit adapted to exhaust the interior of the environment unit.

4. The substrate transfer module according to claim 3, wherein
    the environment unit includes a cleaning device adapted to spray a cleaning material at least towards the holding unit, and
    the cleaning material is one material selected from a group including an inert gas and an aerosol made up of an inert gas and a liquid.

5. The substrate transfer module according to claim 4, wherein the cleaning device scans the holding unit.

6. The substrate transfer module according to claim 5, wherein the cleaning device scans from the holding unit to the moving unit.

7. The substrate transfer module according to claim 1, further comprising:
    an external atmosphere introducing device adapted to introduce the external atmosphere to the transfer chamber, wherein
    the external atmosphere introducing device includes a particle charging unit adapted to charge particles mixed in the introduced external atmosphere so as to generate a potential of a predetermined polarity, and the holding unit includes a potential generating unit adapted to generate, at a surface of the substrate, a potential of identical polarity to the predetermined polarity.

8. The substrate transfer module according to claim 1, wherein the isolation device includes an interior atmosphere introducing device adapted to introduce an interior atmosphere of the transfer chamber to a space isolated in the isolation device, the interior atmosphere introduction device includes a particle charging unit adapted to charge particles mixed in the introduced interior atmosphere so as to generate a potential of a predetermined polarity, and the holding unit includes a potential generating unit adapted to generate, at a surface of the substrate, a potential of identical polarity to the predetermined polarity.

9. The substrate transfer module according to claim 1, further comprising:

an external atmosphere introducing device adapted to introduce the external atmosphere to the transfer chamber; and a substrate charging device adapted to charge the substrate introduced to and extracted from the substrate processing module or a substrate housing vessel that houses the substrate and connects to the transfer chamber, wherein the external atmosphere introducing device includes a particle charging unit adapted to charge particles mixed in the introduced external atmosphere so as to generate a potential of a predetermined polarity, and the substrate charging device charges the substrate to generate a potential of identical polarity to the predetermined polarity.

10. The substrate transfer module according to claim 1, further comprising:

inside the isolation device, a peripheral edge reaction product removal device adapted
to irradiate a peripheral edge of the substrate held by the holding unit with laser light, and
to supply a reactive gas.

11. The substrate transfer module according to claim 1, wherein an internal surface of the isolation device is covered by a photocatalyst.

12. The substrate transfer module according to claim 1, wherein the isolation device includes a potential generating device adapted to charge the isolation device to generate a potential of a predetermined polarity.

13. The substrate transfer module according to claim 1, wherein the isolation device includes a vibration generating device adapted to cause the isolation device to vibrate.

14. The substrate transfer module according to claim 1, wherein the isolation device includes a position adjusting unit located in an interior of the isolation device and adapted to adjust a position of the substrate housed in the interior thereof.

15. The substrate transfer module according to claim 1, further comprising:

a low-temperature device located so as to be exposed to an interior of the isolation device and having a temperature lower than an atmosphere of the interior of the isolation device.

16. The substrate transfer module according to claim 1, further comprising:

a heating device adapted to heat the substrate held by the holding unit in an interior of the isolation device.

17. The substrate transfer module according to claim 1, comprising: a plurality of said substrate transfer devices and a plurality of said isolation devices corresponding to said respective substrate transfer devices.

18. A substrate processing system, comprising:

a substrate processing module adapted to implement desired processing on a substrate;

a substrate housing vessel adapted to house the substrate; and a substrate transfer module connected to the substrate processing module and the substrate housing vessel, and adapted to introduce and extract the substrate to and from the substrate processing module and the substrate housing vessel, wherein the substrate transfer module includes:
a substrate transfer device adapted to transfer the substrate and including
a holding unit adapted to hold the substrate, and
a moving unit adapted to move the holding unit;
a transfer chamber adapted to house the substrate transfer device in an interior that is isolated from the external atmosphere; and
an isolation device adapted to isolate at least the holding unit and the substrate held by the holding unit from an interior atmosphere of the transfer chamber, the isolation device defines a tubular space, and the tubular space is formed by combining two tubular parts, each of which has one end being closed and another end being opened, so as to form a closed space, the two tubular parts are vertically separable from each other so that the tubular space is divided, and the holding unit and the substrate held by said holding unit are exposed when the two tubular parts are separated vertically from each other so that the tubular space of the isolation device is divided.

* * * * *